United States Patent [19]
Konishi et al.

[11] Patent Number: 5,602,493
[45] Date of Patent: Feb. 11, 1997

[54] BIAS CIRCUIT FOR AN INPUT TERMINAL

[75] Inventors: Masayuki Konishi; Mitsuo Kusakabe, both of Itami, Japan

[73] Assignee: Mitsubishi Denki Kabushiki Kaisha, Tokyo, Japan

[21] Appl. No.: 548,060

[22] Filed: Oct. 25, 1995

[30] Foreign Application Priority Data

Dec. 15, 1994 [JP] Japan .................... 6-311728

[51] Int. Cl.⁶ .................................................... H03K 17/22
[52] U.S. Cl. ........................ 326/33; 326/21; 326/31; 327/545
[58] Field of Search ........................ 326/9, 21, 31, 326/33; 327/198, 545

[56] References Cited

U.S. PATENT DOCUMENTS

| 4,560,988 | 12/1985 | Hayashi | 327/545 X |
| 4,940,909 | 7/1990 | Mulder et al. | 326/41 X |
| 5,164,613 | 11/1992 | Mumper et al. | 327/198 X |
| 5,408,435 | 4/1995 | McClure et al. | 326/21 X |

Primary Examiner—David R. Hudspeth
Attorney, Agent, or Firm—Lowe, Price, LeBlanc & Becker

[57] ABSTRACT

A semiconductor device includes a semiconductor switch connected between a power supply terminal and a signal input terminal, and a latch circuit for controlling the ON/OFF of the semiconductor switch, wherein the content of the latch circuit is reset only by a first reset signal and is not reset by a second reset signal for resetting a circuit other than the latch circuit.

10 Claims, 9 Drawing Sheets

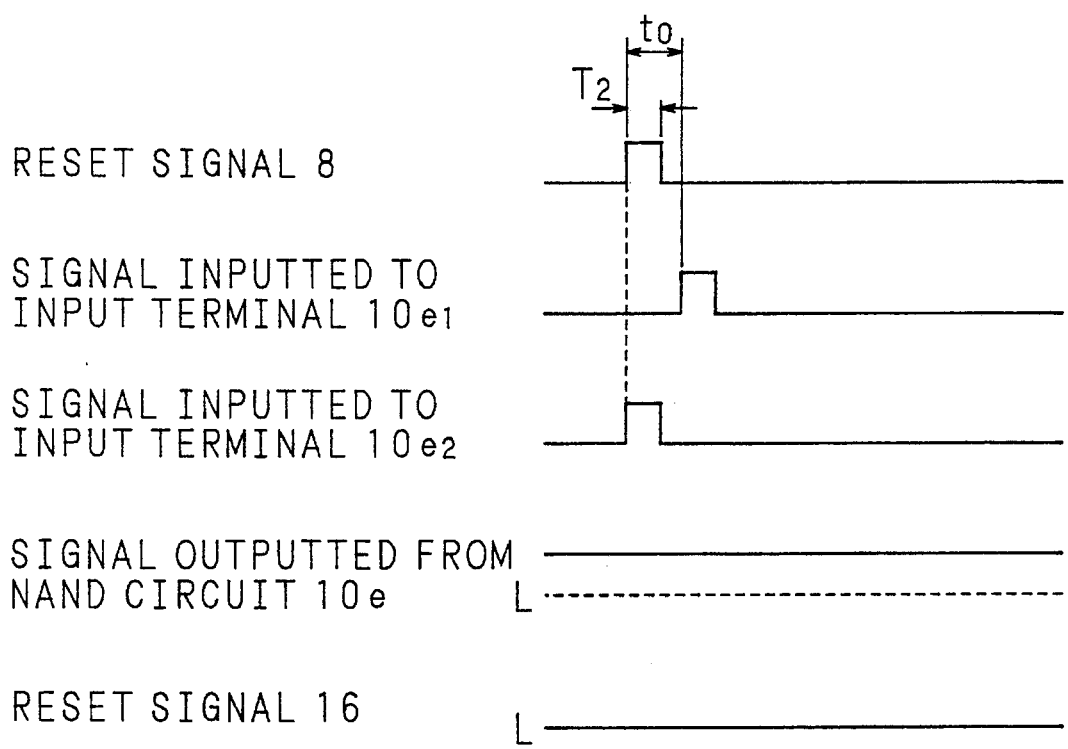

5,602,493

BIAS CIRCUIT FOR AN INPUT TERMINAL

BACKGROUND OF THE INVENTION

1. Field of the Invention

The present invention relates generally to a semiconductor device, and more particularly to a semiconductor device which can stabilize and fix an electric potential at a signal input terminal while the latter is not in use.

2. Description of Related Art

A semiconductor-chip device incorporating a CPU (central processing unit) and circuits controlled by the CPU is provided with a signal input terminal (hereinafter "input terminal"). If this input terminal is kept open (the state of high impedance) while it is not used, the potential at this input terminal is likely to become unstable because of external noise, thereby causing the malfunction of the CPU and other devices. In order to prevent this problem and to stabilize the potential at the input terminal, a source voltage or a grounded voltage is applied to the input terminal.

FIG. 1 is a block diagram showing the known semiconductor device. The illustrated semiconductor device A1 is provided with an input terminal 4 which is connected to a d.c. power supply VC through a mask option division 11 of a P-channel transistor PT, serving as a pull-up resistance, whose source S is connected to the gate G of a P-channel transistor PT. The input terminal 4 is connected to an input terminal of an inverter 12. The semiconductor device A1 is fabricated by injecting B (boron) into the mask option division 11 in the wafer process so as to form a charge path and use the P-channel transistor PT as a pull-up resistance.

In the semiconductor device A1, since the d.c. power supply Vc is connected to the gate G of the P-channel transistor PT, the P-channel transistor PT is likely to remain ON, thereby causing the d.c. power supply Vc to continue to apply a d.c. voltage across the input terminal 4. In this way, while the input terminal 4 is not in use, the potential at the input terminal 4 is fixed by the voltage of the d.c. power supply Vc.

FIG. 2 shows a modified version of the known semiconductor device. The illustrated semiconductor device A2 is provided with an input terminal 4 which is connected to the d.c. power supply Vc through P-channel transistor PT, and also to the input terminal of an inverter 12. A signal from a CPU 15 is inputted to a latch circuit 5 whose content is inputted to the gate of a P-channel transistor PT. The latch circuit 5 has a reset terminal grounded through an N-channel transistor NT. A reset signal 8 is inputted to the gate of the N-channel transistor NT.

In this semiconductor device A2, the signal is inputted to the latch circuit 5 from the CPU 15 so as to lower the content of the latch circuit 5 to L-level. Thus the P-channel transistor PT remains ON, thereby applying a voltage of the d.c. power supply Vc to the input terminal 4. In this way, while the input terminal is not in use, the potential at the input terminal 4 is fixed to the voltage of the d.c. power supply Vc. If a reset signal 8 on H-level occurs within the semiconductor device A2, the reset signal 8 turns on the N-channel transistor NT, thereby resetting the latch circuit 5. The content of the latch circuit 5 is raised to H-level, thereby turning off the P-channel transistor PT. Thus the input terminal 4 is disconnected from the d.c. power supply Vc. Later, when a signal is again inputted to the latch circuit 5 from the CPU 15, the content thereof is lowered to L-level, thereby turning on the P-channel transistor PT. In this way, the potential at the input terminal 4 is fixed by the voltage of the d.c. power supply Vc.

In the semiconductor device shown in FIG. 1, when B (boron) is injected into the mask option division, the P-channel transistor remains ON and is not turned off. As a result, after the semiconductor device A1 is manufactured, if there arises a need for using an input terminal not expected to be used by inputting a signal thereto, it is impracticable. In the semiconductor device shown in FIG. 2, the latch circuit is reset each time a reset signal is generated in the CPU, thereby resulting in the unstability of the potential at the input terminal, and the malfunction of the CPU.

SUMMARY OF THE INVENTION

The present invention is directed to solve the problems discussed above, and an object of the present invention is to provide a semiconductor device which stabilizes and fixes a potential at a signal input terminal not in use.

According to one aspect of the present invention, there is provided a semiconductor device which includes a power supply terminal, a signal input terminal, a semiconductor switch connected between the power supply terminal and the signal input terminal, a latch circuit for controlling the ON/OFF of the semiconductor switch in accordance with the content thereof, a first reset terminal for receiving a first reset signal to reset the latch circuit, and a second reset terminal for receiving a second reset signal to reset a circuit other than the latch circuit.

Preferably, the semiconductor device of the present invention additionally includes a transistor for connecting the latch circuit to the earth therethrough and receiving the first reset signal at its gate, and a logic circuit for receiving the first reset signal and the second reset signal so as to output a logical result to the circuit other than the latch circuit.

When a reset signal is inputted to the first reset terminal, the latch circuit is reset, and when a reset signal is inputted to the second reset terminal, the circuit other than the latch circuit is reset. As a result, when the circuit other than the latch circuit is reset, the latch circuit is kept safe from being reset.

According to another aspect of the present invention, there is provided a semiconductor device which includes a power supply terminal, a signal input terminal, a semiconductor switch connected between the power supply terminal and the signal input terminal, a latch circuit for controlling the ON/OFF of the semiconductor switch in accordance with the content thereof, a timer for outputting a first reset signal in response to a lapsing of a timing period, and a logic circuit for receiving the first reset signal and a second reset signal resetting a circuit other than the latch circuit so as to output a signal to decide the content of the latch circuit.

The timer outputs the first reset signal in response to a lapsing of a predetermined timing period measured. Only when the first reset signal is inputted to the logic circuit, the logic is established to reset the latch circuit. If the second reset signal resetting the circuit other than the latch circuit is inputted to the logic circuit singly or together with the first reset signal, the logic is not established, thereby enabling the latch circuit to be free from being reset. As a result, when the second reset signal resets a circuit other than the latch circuit, the latch circuit is kept safe from being reset.

According to a further aspect of the present invention, there is provided a semiconductor device which includes a power supply terminal, a signal input terminal, a semiconductor switch connected between the power supply terminal and the signal input terminal, a latch circuit for controlling the ON/OFF of the semiconductor switch in accordance with the content thereof; and a pulse width discriminating circuit for outputting a signal when the time width of the reset signal resetting the latch circuit exceeds a predetermined value.

Preferably, the pulse width discriminating circuit includes a signal delay circuit to which the reset signal is inputted, and a logic circuit for receiving the delay signal delayed by the signal delay circuit and the reset signal, and outputting a signal to decide the content of the latch circuit on the basis of the time width of the reset signal.

When the time width of the reset signal resetting the latch circuit exceeds a predetermined value, the pulse width discriminating circuit outputs a signal to reset the latch circuit. If the time width of a reset signal is below a predetermined value, the pulse width discriminating circuit does not output any signal, thereby enabling the latch circuit to be free from being reset. Thus, a resetting signal is distinguished from noise having a small time width, thereby preventing noise from resetting the latch circuit. The above and further objects and features of the invention will more fully be apparent from the following detailed description with the accompanying drawings.

BRIEF DESCRIPTION OF THE DRAWINGS

FIG. 9 is a timing chart showing the timing of a signal from each division in the pulse width discriminating circuit shown in FIG. 7.

DESCRIPTION OF THE PREFERRED EMBODIMENTS

Figure 1:
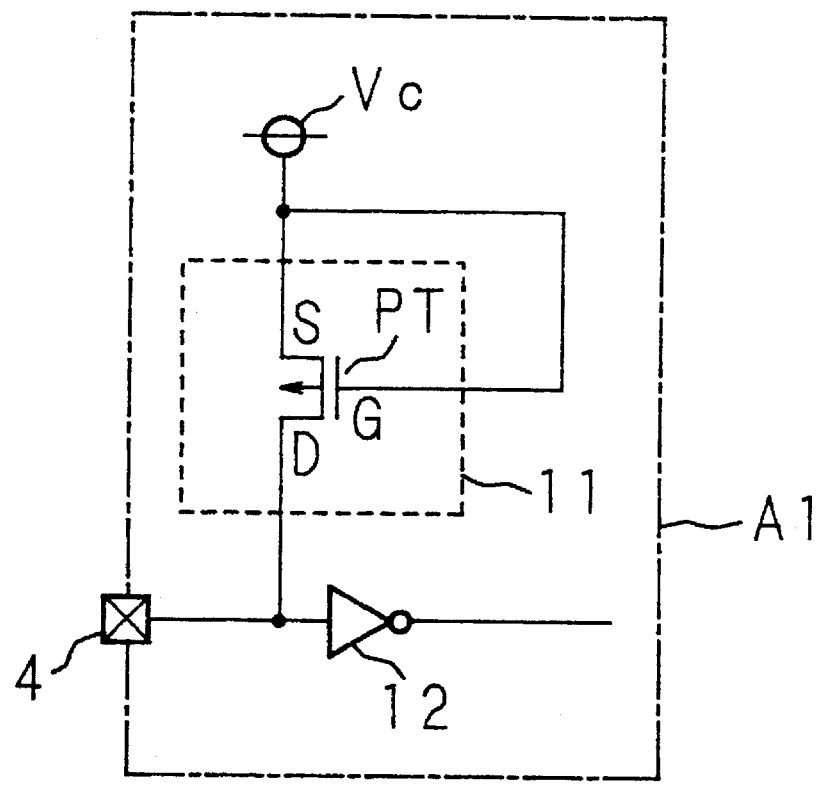
FIG. 1 is a block diagram showing a main portion of a known semiconductor device.
Figure 2:
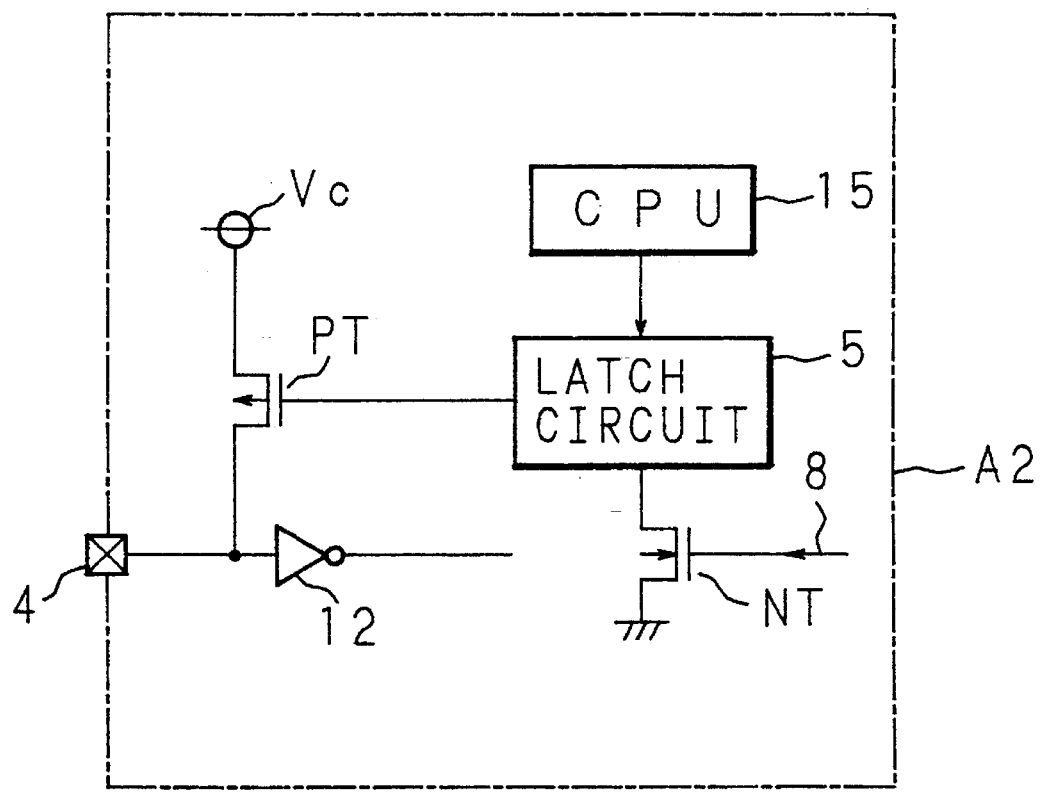
FIG. 2 is a block diagram showing another portion of the known semiconductor device.

The present invention will be described by way of examples which are illustrated in the drawings:

EXAMPLE 1

Figure 3:
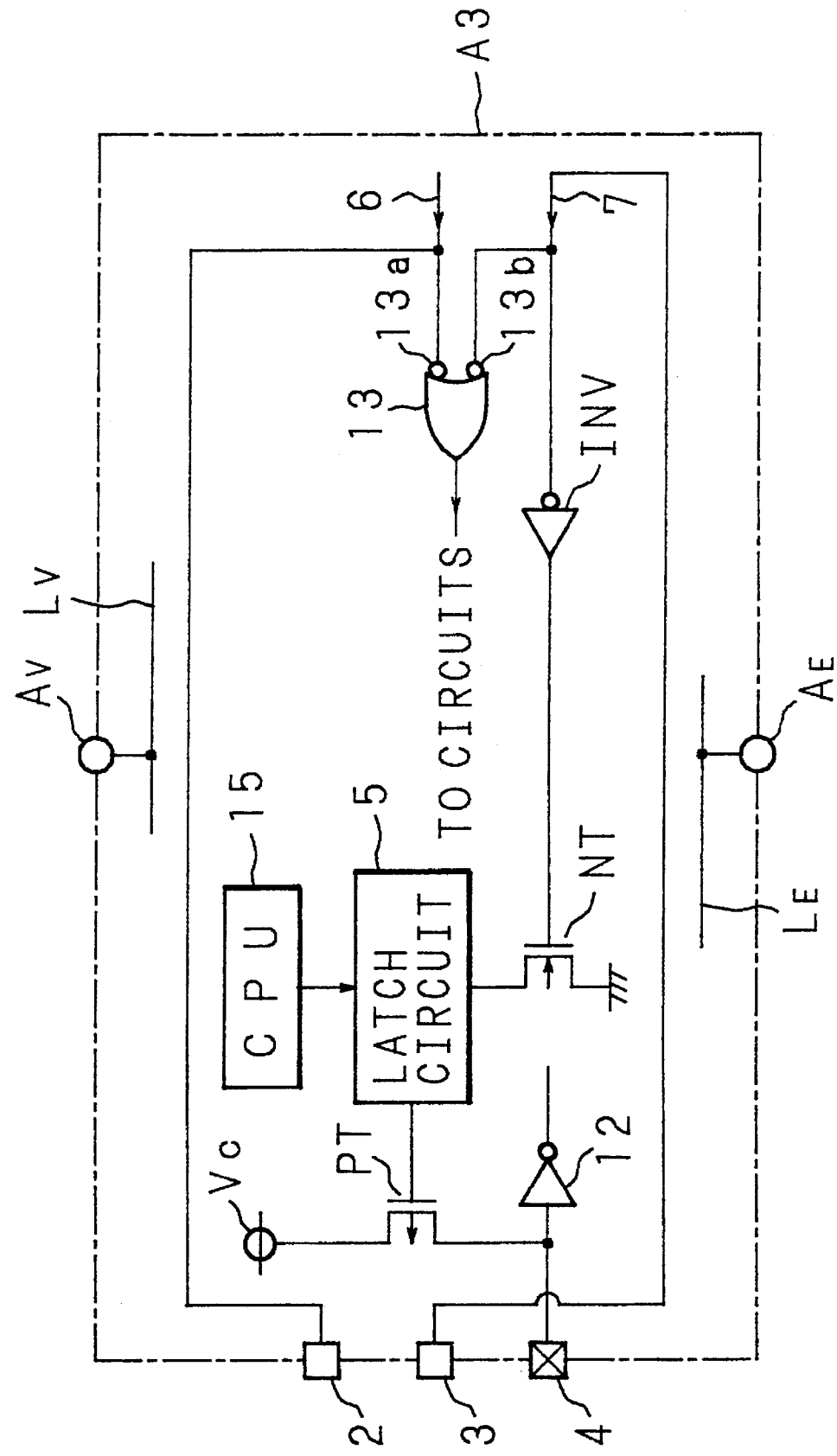
FIG. 3 is a block diagram showing a main portion of a semiconductor device according to the present invention.

Referring to FIG. 3, the exemplary semiconductor device A3 includes a power supply terminal $A_V$, an grounded terminal $_E$, a first reset terminal 3, a second reset terminal 2 and an input terminal 4. The second reset terminal 2 is connected to an input terminal 13a of a NAND circuit 13, and the input terminal 13a receives a reset signal 6 generated in the semiconductor device A3. The first reset terminal 3 is connected to the other input terminal 13b of the NAND circuit 13, and to an inverter having an output terminal connected to the gate of an N-channel transistor NT. A reset signal from the NAND circuit 13 is inputted to each circuit (not shown) except for a latch circuit which will be referred to below. The input terminal 4 is connected to a d.c. source Vc connected to a power supply terminal $A_V$ through a P-channel transistor PT and also to the input terminal of an inverter 12. An signal outputted from a CPU 15 is inputted to a latch circuit 5 whose content is inputted to the gate of the P-channel transistor PT. The reset terminal of the latch circuit 5 is grounded through the N-channel transistor NT. The power supply terminal $A_V$ is connected to an interior power line Lv, and the grounded terminal $A_E$ is connected to an interior earth line LE.

Figure 4:
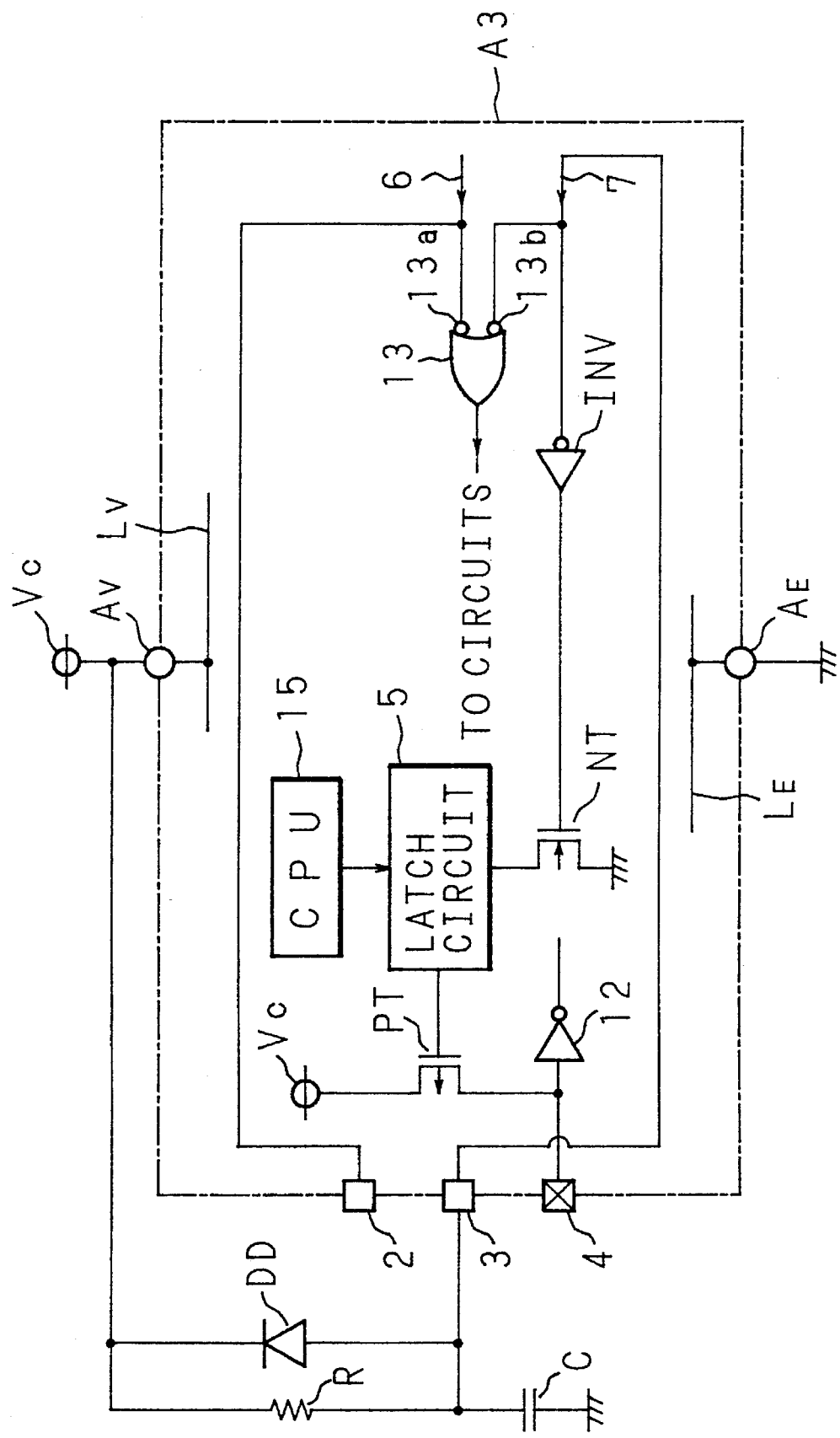
FIG. 4 is a circuit diagram showing the operation of the semiconductor shown in FIG. 3.

FIG. 4 is a circuit diagram showing the operation of the semiconductor device A3 connected to the outside for use as shown in FIG. 3. The source terminal $A_V$ is connected to a d.c. power supply Vc, and the terminal $A_E$ is grounded. The first reset terminal 3 is connected to the exterior d.c. source Vc through a diode DD connected thereto, and grounded through a capacitor C. A resistance R is connected in parallel with the diode DD.

The semiconductor device A3 is operated as follows:

The connection of the power supply terminal $A_V$ to the d.c. power supply Vc increases the voltage at the first reset terminal 3 with a time constant depending upon the resistance R and the capacitor C, so that a first reset signal 7 having a H (high) level is inputted to the first reset terminal 3. Before the power supply terminal $A_V$ is connected to the d.c. power supply Vc, the voltage at the capacitor C is so low that the first reset signal 7 has a L (low) level. A shifting from L-level to H-level turns on the N-channel transistor NT, thereby resetting the latch circuit 5. The content of the latch circuit 5 rises to the H-level, thereby turning off the P-channel transistor PT. Thus the input terminal 4 is disconnected from the d.c. power supply Vc. The first reset signal 7 is inputted to each circuit (not shown) except for the latch circuit 5, thereby resetting these circuits. In this way the latch circuit 5 and other circuits (not shown) are reset at the initial period of operation.

When the CPU 15 inputs a signal to the latch circuit 5 so as to release the latch circuit 5 from being reset, the content of the latch circuit 5 lowers to the L-level, thereby turning on the P-channel transistor PT through which the input terminal 4 is connected to the d.c. source Vc. In this way the d.c. source Vc raises the input terminal 4 to the H-level where the potential thereof is fixed. The CPU 15 also releases all the circuits (not shown) other than the latch circuit 5 from being reset.

If a second reset signal 6 occurs within the semiconductor device A3, the second reset signal 6 is inputted to each circuit (not shown) through the NAND circuit 13, so that the circuit except for the latch circuit 5 is reset. If the first reset terminal 2 happens to receive a reset signal generated outside, all the circuits other than the latch circuit 5 are reset in the same manner as described above. When the latch circuit 5 is reset in response to a signal from the CPU 15, the content of the latch circuit 5 rises to H-level, thereby turning off the P-channel transistor PT. Thus the signal input terminal 4 is disconnected from the d.c. power supply Vc, thereby enabling the input terminal 4 to receive a signal. In this way the input terminal 4 is ready for use.

As is evident from the foregoing description, the latch circuit 5 and the other circuits are reset altogether at the initial stage when the semiconductor device A3 is connected to the d.c. power supply Vc, but at the subsequent period of time these circuits can be individually reset, thereby preventing the latch circuit 5 from being reset even if the first reset signal 6 occurs.

EXAMPLE 2

Figure 5:
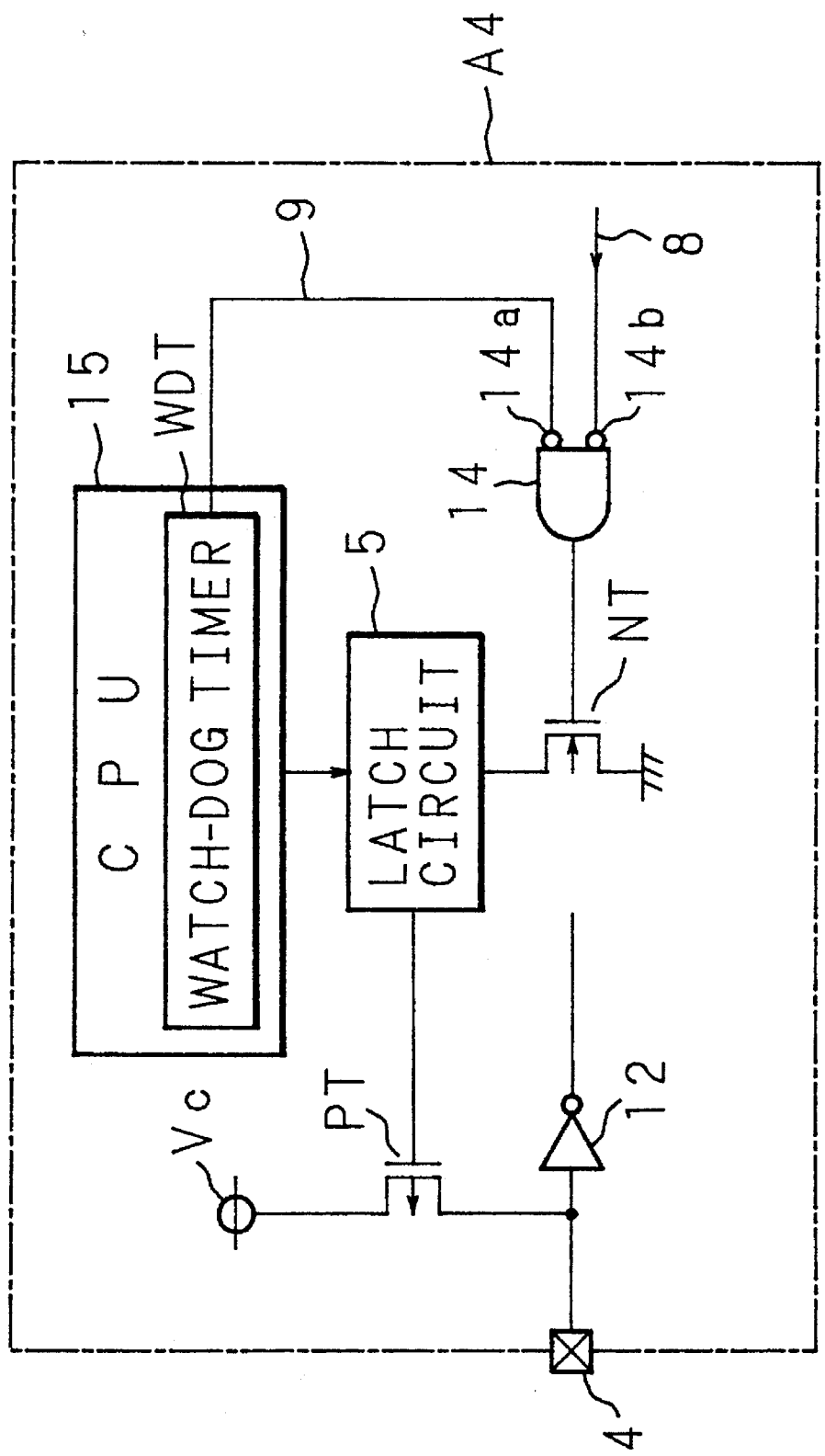
FIG. 5 is a block diagram showing a main portion of a modified version of the semiconductor device according to the present invention.

Referring to FIG. 5, another example according to the present invention will be described:

The exemplary semiconductor device A4 includes an input terminal 4 connected to a d.c. power supply Vc through a P-channel transistor PT, and is connected to the input terminal of the inverter 12. A signal outputted by the CPU 15 is inputted to the latch circuit 5 whose content is inputted to the gate of a P-channel transistor PT. The latch circuit 5 includes a reset terminal grounded through an N-channel transistor NT. The CPU 15 includes a watch-dog timer WDT which outputs a reset signal 9 to be inputted to an input terminal 14a of a NOR circuit 14. A reset signal 8 occurring within the semiconductor device A4 is inputted to the other input terminal 14b of the NOR circuit 14. A reset signal outputted by the NOR circuit 14 is inputted to the gate of the N-channel transistor NT.

The semiconductor device according to EXAMPLE 2 is operated as follows:

When a signal from the CPU 15 is inputted to the latch circuit 5 and the content of the latch circuit 5 rises to L-level, the P-channel transistor PT is ON. The resulting connection between the input terminal 4 and the d.c. power supply Vc pulls up the input terminal 4, and the potential at the input terminal 4 is fixed. In this state, until a watch dog timer WDT designed to monitor an operative "runaway" or malfunction of the CPU 15 reaches a particular time, the watch dog timer WDT does not generate a reset signal 9 which is an overflow signal of L-level, and leaves the input terminal 14a of the NOR circuit 14 at H-level. In this state, while no reset signal 8 at H-level is generated to reset all the circuits except for the latch circuit 5, the other input terminal 14b of the NOR circuit 14 keeps the L-level, and the output signal from the NOR circuit 14 keeps the L-level.

When a reset signal 8 at H-level is generated, the other input terminal 14b of the NOR circuit 14 keeps the H-level, and the output signal from the NOR circuit 14 becomes L-level. Independently of the reset signal 8, the N-channel transistor NT is not on, and the latch circuit 5 is not reset, thereby keeping the input terminal 4 pulled up. While no reset signal 8 is not generated, the watch dog timer WDT outputs a reset signal 9 of L-level which is an overflow signal, the output signal is inverted into a H-level signal. As a result of the inversion, the N-channel transistor NT is ON, thereby resetting the latch circuit 5. In this way, when the reset signal 8 for all the circuits except for the latch circuit 5 is generated, the latch circuit 5 is safe from being reset.

When the resetting of the latch circuit 5 is released in response to a signal from the CPU 15, and the content thereof is raised to H-level, the P-channel transistor PT is OFF, thereby disconnecting the input terminal 4 from the d.c. power supply Vc. Thus the input terminal 4 is ready for use.

EXAMPLE 3

Figure 6:
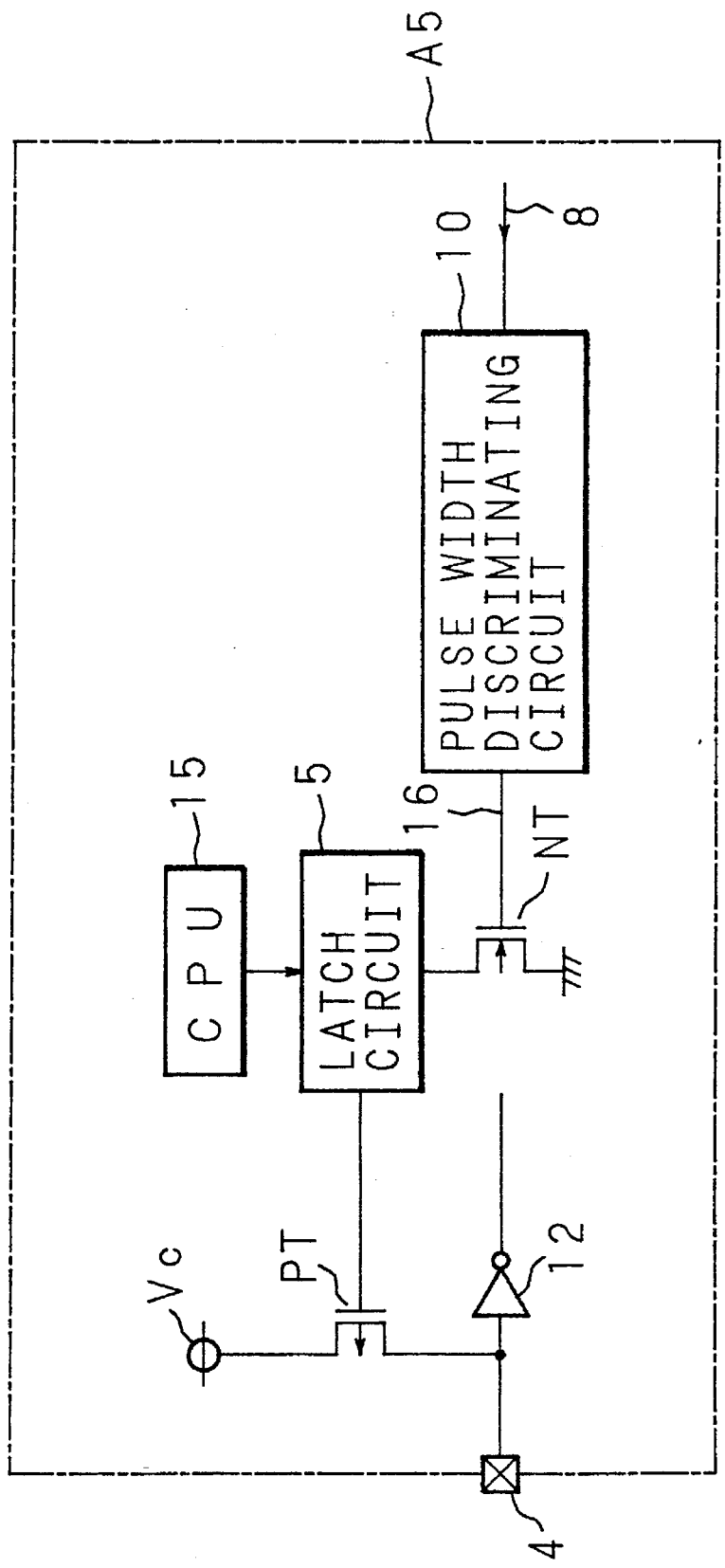
FIG. 6 is a block diagram showing a main portion of another modified version of the semiconductor device according to the present invention.

Referring to FIG. 6, EXAMPLE 3 will be described:

The exemplary semiconductor device A5 includes a pulse width discriminating circuit 10, and an input terminal 4 connected to a d.c. power supply Vc through the P-channel transistor PT, and is connected to the input terminal of the inverter 12. A signal from the CPU 15 is inputted to the latch circuit 5 whose content is inputted to the gate of the P-channel PT. The reset terminal of the latch circuit 5 is grounded through the N-channel transistor NT. The reset signal 8 for resetting each circuits other than the latch circuit 5 is inputted to the pulse width discriminating circuit 10 whose output signal is inputted to the gate of the N-channel transistor NT. The pulse width discriminating circuit 10 generates a signal when the time width of the reset signal 8 exceeds a predetermined width.

Figure 7:
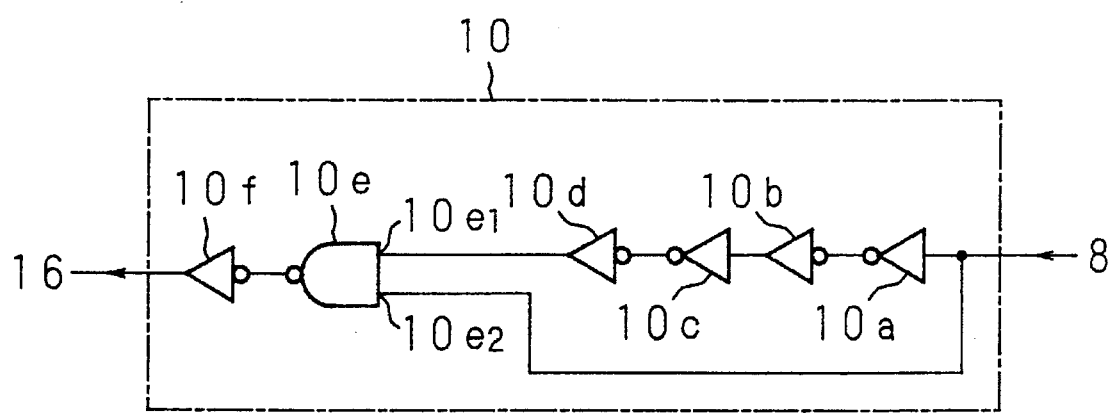
FIG. 7 is a pulse width discriminating circuit for discriminating a pulse width shown in FIG. 6.

Referring to FIG. 7, the pulse width discriminating circuit 10 will be described in detail:

The reset signal 8 is inputted to the inverter 10a which outputs a signal to be inputted to the inverter 10b. The inverter 10b outputs a signal to be inputted to the inverter 10c which outputs a signal to be inputted to an inverter 10d. The inverter 10d outputs a signal inputted to an input terminal $10e_1$ of a NAND circuit 10e. The other input terminal $10e_2$ directly receives the reset signal 8. A signal outputted from the NAND circuit 10e is inputted to the inverter 10f which outputs a reset signal 16.

Figure 8:
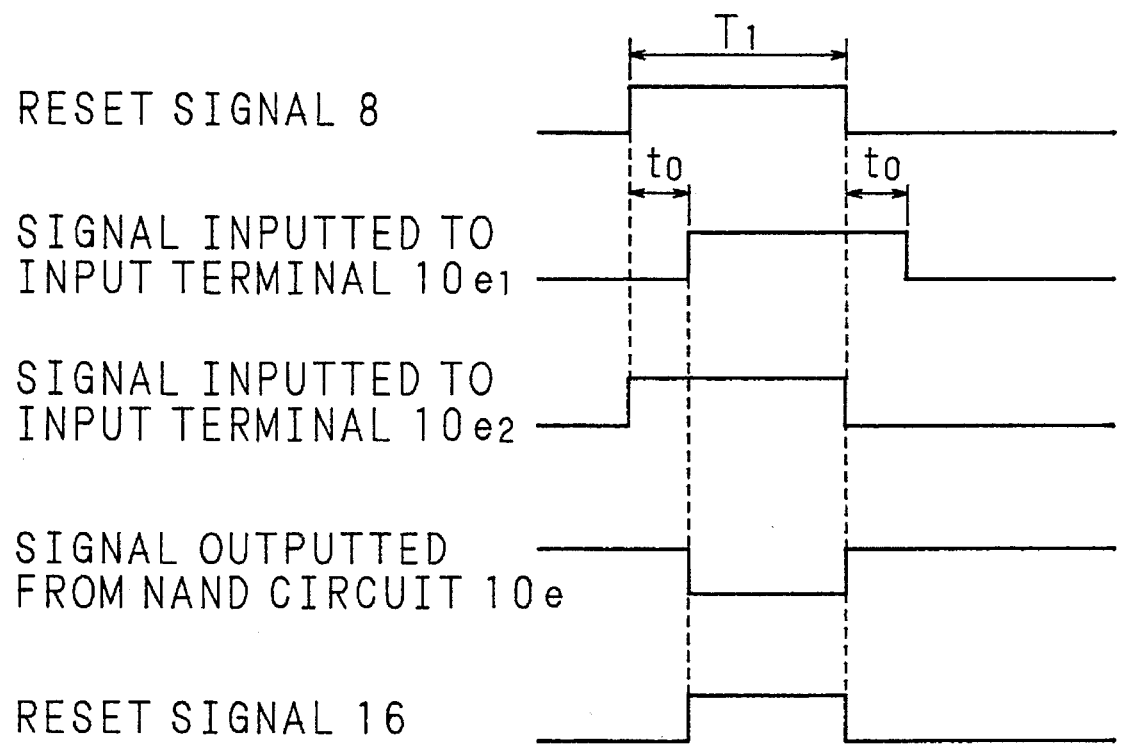
FIG. 8 is a timing chart showing the timing of a signal from each division in the pulse width discriminating circuit shown in FIG. 7.

Referring to FIGS. 8 and 9 showing the timing charts of signals, the operation of EXAMPLE 3 will be described:

A signal from the CPU 15 is inputted to the latch circuit 15 so as to lower the content of the latch circuit 5 to L-level. Then the P-channel transistor PT is ON, thereby effecting the connection between the input terminal 4 and the d.c. power supply Vc. In this way the input terminal 4 is held at a pulled-up state by the d.c. power supply Vc.

When a reset signal 8 having a time width $T_1$ shown in FIG. 8 is inputted to the pulse width discriminating circuit 10 where the reset signal 8 is successively inverted at the inverters 10a, 10b, 10c and 10d, and a lag occurs because of the continued inversion. As a result, the input terminal $10e_1$ receives the reset signal 8 a time period $t_0$ later than the reset signal 8 initially inputted to the inverter 10a. The other terminal $10e_2$ of the NAND circuit 10e receive the reset signal 8 without delay shown in FIG. 8. In this way, when the logic of the reset signal 8 is established between the input terminals $10e_1$ and $10e_2$ of the NAND circuit 10e, the output signal from the NAND circuit 10e is inverted into an L-level as shown in FIG. 8, and inverted at the inverter 10f which outputs a reset signal 16 at H-level as shown in FIG. 8. The N-channel transistor NT is ON, thereby resetting the latch circuit 5.

When the pulse H-level circuit 10 receives a reset signal having the time width $T_2$ ($T_2<T_1$) as shown in FIG. 9, this reset signal 8 is successively inverted at the inverters 10a to 10d and is delayed. Another reset signal 8 is inputted to the input terminal $10e_1$ of the NAND circuit 10e a time $t_0$ later than the first-mentioned reset signal 8. The other input terminal $10e_2$ thereof receives a reset signal 8 without delay as shown in FIG. 9. Thus no logic of the reset signal 8 is established between the input terminals $10_1$ and $10_2$. As a result, the output signal from the NAND circuit 10e remains H-level as shown in FIG. 9, and is inverted at the inverter 10f which outputs an L-level signal as shown in FIG. 9. In this way no H-level reset signal 16 is generated. Thus, it is ensured that the N-channel transistor NT is kept OFF and the latch circuit 5 is not reset.

In this way, the pulse width discriminating circuit 10 discriminates two cases where the time width of the reset signal 8 exceeds a predetermined value or where it is below it, and indicates it by outputting a signal when the time width of a reset signal 8 is greater than the delay time $t_0$ mused by the inverters 10a to 10d and generating no signal when it is smaller than the delay time $t_0$. The delay time $t_0$ depends upon the number of inverters.

By discriminating the time width of a reset signal 8, a reset signal can be distinguished from noise, thereby preventing the latch circuit from being reset by noise. In addition, in a case where a reset signal is inputted from the outside, if the period of time spent on inputting a reset signal is shorter than a predetermined value, the signal does not function as a reset signal but is ineffective to reset the latch circuit as noise.

In the examples described above, the input terminal is pulled up so as to fix the potential at the input terminal thereby applying a voltage from a d.c. power supply. It is also possible to pull it down with a grounded power source through a P-channel transistor between the input terminal and the grounded power source. In each of the examples the P-channel transistor PT is connected to a grounded terminal $A_E$. The same effects result.

In the examples described above, the P-channel transistor PT is connected to the internal d.c. power supply Vc but it can also be connected to an external power supply through a source terminal $A_V$. The transistor which pulls up or down the input terminal is not limited to a P-channel transistor. The pulse width discriminating circuit is constructed by connecting a plurality of inverters in series, but it is illustrative. For example, it can be constructed with a delay circuit including capacitors and resistances.

As is evident from the foregoing description, the semiconductor device according to the present invention includes two reset terminals; the first reset terminal receiving a reset signal for resetting the circuits other than the latch circuit and the second reset terminal receiving a reset signal for resetting the latch circuit. As a result, if a reset signal occurs to reset a circuit other than the latch circuit, the latch circuit is prevented from being inadvertently reset by the reset signal, thereby reducing the frequency of resetting the latch circuit. Thus, the electric potential at the input terminal is stabilized; otherwise, the potential at this input terminal is likely to be unstable owing to the frequent resetting of the latch circuit. In this way, the potential at the input terminal not in use is maintained constant.

Furthermore, the semiconductor device of the present invention is also provided with a logic circuit designed to output a signal to a timer in response to each lapse of a predetermined period of time and to receive a reset signal for resetting a circuit other than the latch circuit. The latch circuit is reset by a reset signal outputted from the logic circuit, so that even if a reset signal resetting a circuit other than the latch circuit occurs, the latch circuit is prevented from being reset. Thus the potential at the input terminal not in use is stabilized and fixed.

In addition, the semiconductor device of the present invention is provided with an extra circuit for discriminating the time width of a reset signal so as to distinguish between the reset signal and noise. Thus the latch circuit is protected from being reset by noise, thereby reducing the number of resetting the latch circuit, and contributing to the stabilizing and fixing of the potential at the input terminal not in use.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor device comprising:

a power supply terminal;

a signal input terminal;

a semiconductor switch connected between the power supply terminal and the signal input terminal;

a latch circuit for controlling the ON/OFF of the semiconductor switch in accordance with the content thereof;

a first reset terminal for receiving a first reset signal to reset the latch circuit; and a second reset terminal for receiving a second reset signal to reset a circuit other than the latch circuit.

2. The semiconductor device according to claim 1, wherein the power supply terminal is a grounded terminal.

3. The semiconductor device according to claim 1, further comprising:

a transistor for connecting the latch circuit to the earth therethrough and receiving the first reset signal at its gate; and a logic circuit for receiving the first reset signal and the second reset signal so as to output a logical result to the circuit other than the latch circuit.

4. The semiconductor device according to claim 3, wherein the power supply terminal is a grounded terminal.

5. A semiconductor device comprising:

a power supply terminal;

a signal input terminal;

a semiconductor switch connected between the power supply terminal and the signal input terminal;

a latch circuit for controlling the ON/OFF of the semiconductor switch in accordance with the content thereof;

a timer for outputting a first reset signal in response to a lapsing of a timing period; and a logic circuit for receiving the first reset signal and a second reset signal resetting a circuit other than the latch circuit so as to output a signal to decide the content of the latch circuit.

6. The semiconductor device according to claim 5, wherein the power supply terminal is a grounded terminal.

7. A semiconductor device comprising:

a power supply terminal;

a signal input terminal;

a semiconductor switch connected between the power supply terminal and the signal input terminal;

a latch circuit for controlling the ON/OFF of the semiconductor switch in accordance with the content thereof; and a pulse width discriminating circuit for outputting a signal when the time width of the reset signal resetting the latch circuit exceeds a predetermined value.

8. The semiconductor device according to claim 7, wherein the power supply terminal is a grounded terminal.

9. The semiconductor device according to claim 7, wherein the pulse width discriminating circuit includes:

a signal delay circuit to which the reset signal is inputted; and a logic circuit to which the signal delayed by the signal delay circuit and the reset signal are inputted, for outputting a signal to decide the content of the latch circuit on the basis of the time width of the reset signal.

10. The semiconductor device according to claim 9, wherein the power supply terminal is a grounded terminal.

* * * * *